(12) United States Patent
Joshi et al.

(10) Patent No.: US 10,109,556 B2
(45) Date of Patent: Oct. 23, 2018

(54) SYSTEMS AND METHODS FOR SPRING-BASED DEVICE ATTACHMENT

(71) Applicant: Toyota Motor Engineering & Manufacturing North America, Inc., Erlanger, KY (US)

(72) Inventors: Shailesh N. Joshi, Ann Arbor, MI (US); Masao Noguchi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 5 days.

(21) Appl. No.: 15/062,833

(22) Filed: Mar. 7, 2016

(65) Prior Publication Data
US 2017/0256475 A1  Sep. 7, 2017

(51) Int. Cl.
| H01L 29/49 | (2006.01) |
| H01L 23/40 | (2006.01) |
| H01L 23/367 | (2006.01) |
| H01L 21/52 | (2006.01) |
| H01L 23/04 | (2006.01) |

(52) U.S. Cl.
CPC .............. *H01L 23/40* (2013.01); *H01L 21/52* (2013.01); *H01L 23/04* (2013.01); *H01L 23/3675* (2013.01)

(58) Field of Classification Search
CPC ............................ F27B 17/0025; H01L 23/40
See application file for complete search history.

(56) References Cited

U.S. PATENT DOCUMENTS

| 5,061,191 A | 10/1991 | Casciotti et al. |
| 5,663,596 A | 9/1997 | Little |
| 5,923,083 A | 7/1999 | Autry et al. |
| 6,313,523 B1 | 11/2001 | Morris et al. |
| 6,930,385 B2 | 8/2005 | Hsu et al. |
| 7,045,889 B2 | 5/2006 | Canella |
| 7,110,622 B2 | 9/2006 | Deacon et al. |
| 8,128,418 B1 | 3/2012 | Determan et al. |
| 8,614,514 B1 | 12/2013 | Powers et al. |
| 8,963,324 B2 * | 2/2015 | Sato .................... H01L 23/3672 257/718 |
| 2008/0045076 A1 | 2/2008 | Dittmann et al. |
| 2016/0273836 A1* | 9/2016 | Obara ................. F27B 17/0016 |

* cited by examiner

*Primary Examiner* — Michael Shingleton
(74) *Attorney, Agent, or Firm* — Dinsmore & Shohl, LLP (57) ABSTRACT

Apparatuses for coupling a semiconductor device to a cooling system, methods of coupling a semiconductor device to a cooling system, and systems incorporating the apparatuses are disclosed. An apparatus includes a first frame member coupled to the cooling system, a second frame member coupled via one or more fasteners to the first frame member, and a spring assembly disposed between the first frame member and the second frame member. The semiconductor device is disposed between the spring assembly and the second frame member.

10 Claims, 12 Drawing Sheets

SYSTEMS AND METHODS FOR SPRING-BASED DEVICE ATTACHMENT

TECHNICAL FIELD

The present specification generally relates to bonding components in power electronics assemblies and, more specifically, to using a spring-based device to bind components together.

BACKGROUND

In power electronics assemblies, a semiconductor device may be bonded to a substrate, a cooling system, and/or the like via a bond layer, such as a solder layer, a diffusion bond layer, and the like. However, such bond layers may be noncompliant, have a low compliance, may contain complicated arrangements, and may not handle stresses, such as thermally induced stress due to coefficient of thermal expansion mismatch, sufficiently.

Accordingly, a need exists for systems and methods that provide dry metal-to-metal contact without using a bond layer.

SUMMARY

In one embodiment, an apparatus for coupling a semiconductor device to a cooling system includes a first frame member coupled to the cooling system, a second frame member coupled to the first frame member by one or more fasteners, and a spring assembly disposed between the first frame member and the second frame member. The semiconductor device is disposed between the spring assembly and the second frame member.

In another embodiment, a method of coupling a semiconductor device to a cooling system includes coupling a first frame member to the cooling system, placing a spring assembly on the first frame member, placing the semiconductor device on the spring assembly, placing a second frame member on the semiconductor device such that the semiconductor device and the spring assembly are disposed between the second frame member and the first frame member, and affixing the second frame member to the first frame member with one or more fasteners.

In yet another embodiment, a semiconductor device assembly includes a cooling system, a first frame member coupled to the cooling system via a bottom layer, a second frame member coupled via one or more fasteners to the first frame member, a spring assembly, a semiconductor device, and a top layer coupled to the semiconductor device. The spring assembly is disposed between the first frame member and the semiconductor device, the semiconductor device is disposed between the top layer and the spring assembly, the top layer is disposed between the semiconductor device and the second frame member, and the first frame member and second frame member provide a compressive force on the spring assembly, the semiconductor device, and the top layer to retain the spring assembly, the semiconductor device, and the top layer in a held configuration.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

The embodiments described herein are generally directed to apparatuses and methods for coupling a semiconductor device to a cooling system, as well as semiconductor devices that use a spring-based attachment. More specifically, the embodiments described herein eliminate a need for a monolithic bond layer that keeps the cooling system intact by incorporating an assembly that includes a frame and a compliant member, such as a spring. Use of the assembly in lieu of a bond layer reduces or eliminates cracking and remelting issues that may occur, particularly in instances where the semiconductor device operates at a high temperature. In addition, use of the assembly may further add compliance, may reduce the cost of assembly, and/or may allow for interchangeable parts.

Figure 1:
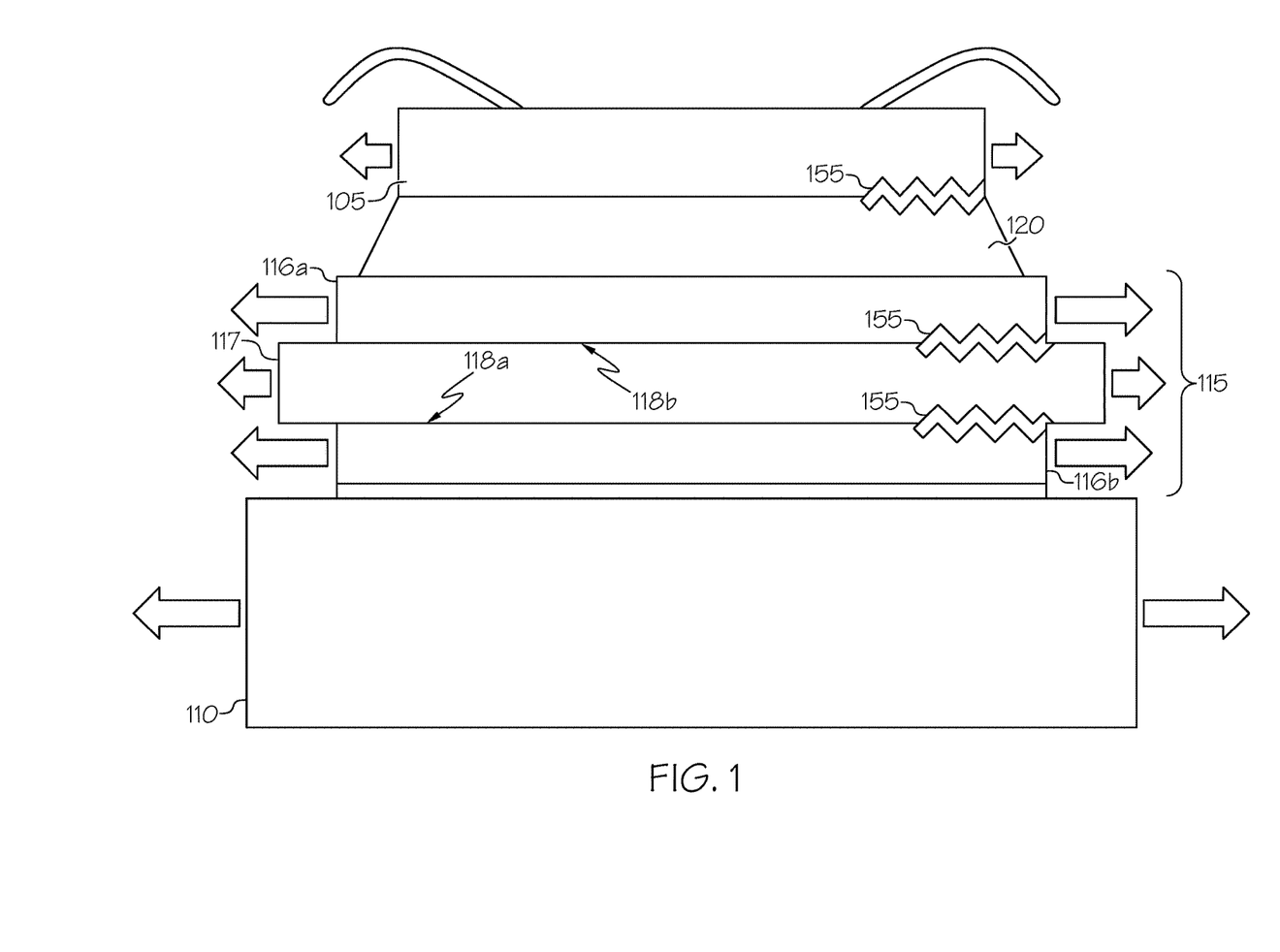
FIG. 1 schematically depicts a side view of an illustrative power electronics assembly.

Semiconductor devices, particularly in power electronics applications, can be joined to various components via one or more bond layers. For example, as shown in FIG. 1, a semiconductor device 105 may be bonded to a substrate 115, which, in turn, may be bonded to a cooling system 110, such as a heat sink or the like. As depicted in FIG. 1, the substrate 115 may be a metal-ceramic-metal substrate, such as a direct bonded copper (DBC) substrate. The substrate 115 may include a first metal layer 116a, a second metal layer 116b, and a ceramic layer 117. The substrate 115 may generally be arranged such that the ceramic layer 117 is sandwiched between the first metal layer 116a and the second metal layer 116b such that the first metal layer 116a is bound to a first surface 118a of the ceramic layer 117 and the second metal layer 116b is bound to a second surface 118b of the ceramic layer 117.

As also shown in FIG. 1, the substrate 115 (particularly, the first metal layer 116a) may be bonded to the semiconductor device 105 via a bond layer 120. In an alternative configuration (not shown), a single metal layer may be bound to a single ceramic layer and to the semiconductor device 105 via the bond layer 120.

In the arrangement depicted in FIG. 1, as well as other arrangements not specifically illustrated herein, the bond layer 120 may be comprised of a bond layer material, particularly a material that is suited for bonding components of semiconductor devices together. A bond layer may generally be constructed of materials that are designed to withstand stresses, including stresses caused by lateral forces, vertical forces, longitudinal forces, torsional forces, temperature, and/or the like. Illustrative bond layers may be made of materials that include, but are not limited to, solder, transient liquid phase (TLP) bonding material, and silver (Ag) sinter. Solder is generally a fusible metal alloy. Illustrative examples of solder include, but are not limited to, alloys containing tin, lead, copper, silver, bismuth, indium, zinc, cadmium, and/or antimony. TLP bonding refers to a diffusion bonding process where interlayer materials are disposed between substrate layers being bonded to form an assembly. TLP bonding allows a bond to be formed at a low temperature, while the remelting temperature of the resulting bond is much higher. Ag sinter is generally a silver containing sintering material that can be formed into a solid mass via application of heat and/or pressure.

While the bond layer 120 is generally constructed of materials that are designed to withstand stresses, such materials can fail. For example, typical operation conditions of the semiconductor device 105 may expose the various components to elevated temperatures greater than typical room temperature. Such temperatures may cause the bond layer 120 to melt, change form, crack, and/or the like. For example, FIG. 1 indicates a crack 155 in the bond layer 120. In addition, various components of the substrate 115 may expand, which may also cause cracks 155 to form between the various layers, such as, for example, a crack 155 between the first metal layer 116a and the ceramic layer 117 and/or a crack 155 between the second metal layer 116b and the ceramic layer 117.

When such deformations occur, the cooling system 110 may not appropriately cool the semiconductor device 105, the semiconductor device 105 may become dislodged from electrical contacts that connect the semiconductor device 105 to other components, and/or the like. Moreover, otherwise usable portions of the entire structure (such as, for example, the semiconductor device 105 and/or the cooling system 110) may be discarded because they cannot be effectively be separated from the bond layer 120 and reused. Discarding of otherwise usable components may increase the cost of manufacture.

Accordingly, the systems, apparatuses, and methods described herein replace the bond layer between a semiconductor device and a substrate and/or a cooling system with a coupling apparatus that includes one or more compliant members, such as springs. The systems and apparatuses described herein may exhibit increased compliance, may be less susceptible to cracking, deformation, and/or the like that occurs at increased temperatures, can provide a means for transmitting electrical signals or allowing heat flux, and/or the like.

As used herein, the term "compliance" refers to the ability of an object of a component to yield or bend under a load (i.e., without causing a movement of other portions of the component). Generally, a less rigid structure may be more compliant than a structure of greater rigidity. Thus, as used herein, a more compliant structure may be more likely to yield or bend under load between a semiconductor device and a substrate/cooling system without disrupting the particular positioning and placement of the semiconductor device and/or the substrate/cooling system, whereas a less compliant structure may be less likely to yield or bend under load between the semiconductor device and the substrate/cooling system and/or may disrupt the particular positioning and placement of the semiconductor device and/or the substrate/cooling system.

Figure 2:
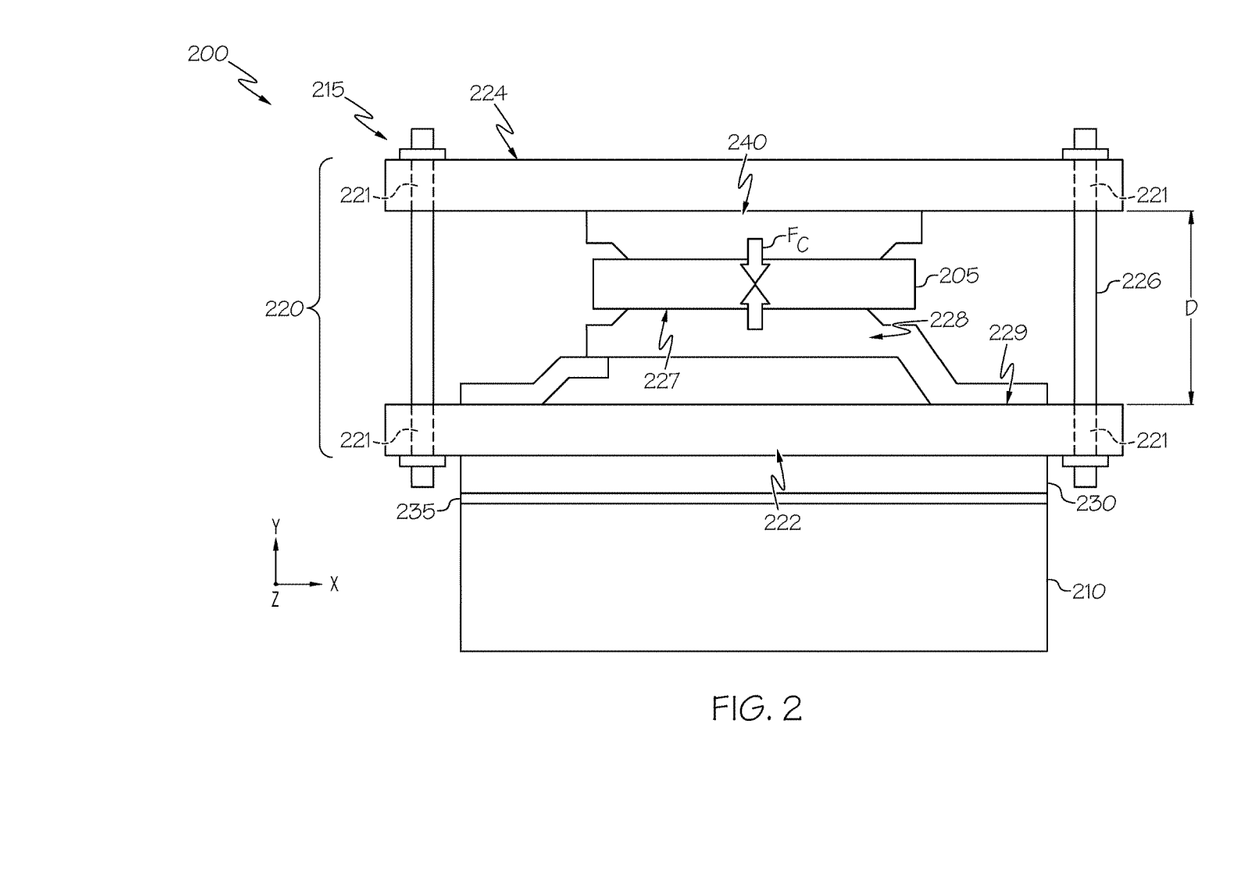
FIG. 2 schematically depicts a side view of a system including a coupling apparatus according to one or more embodiments shown and described herein.

FIG. 2 depicts an illustrative system including a coupling apparatus that does not require a bond layer. As shown in FIG. 2, the system, generally designated 200, includes a semiconductor device 205, a cooling system 210, and a coupling apparatus 215 that includes a frame assembly 220. As will be described in greater detail herein, the system 200 may generally be arranged such that the coupling apparatus 215 retains the semiconductor device 205 therein and the coupling apparatus 215 is coupled to the cooling system 210.

The semiconductor device 205 may generally be an electronic component that exploits the electronic properties of semiconductor materials, such as, without limitation, silicon, germanium, gallium arsenide (GaAs), silicon carbide (SiC), and organic materials. A semiconductor device as used herein is not limited to a particular type, and may include for example, a chip (i.e., a die) or the like that contains circuit elements contained within a package, an integrated circuit (IC), and/or the like. In some embodiments, the semiconductor device 205 may include a bipolar junction transistor, such as a metal-oxide-semiconductor field-effect transistor (MOSFET) or an insulated gate bipolar transistor (IGBT). Other semiconductor devices not specifically disclosed herein (including those now known or later developed) are contemplated and possible.

The cooling system 210 may be a device that cools the semiconductor device 205. The cooling system 210 is not limited by this disclosure, and may generally be any structure or device that is used for cooling. Illustrative cooling systems include, but are not limited to, a finned heat sink, a jet impingement cooling system, a two-phase cooling system, and the like. Other cooling systems not specifically disclosed herein (including those now known or later developed) are contemplated and possible.

As shown in FIG. 2, the coupling apparatus 215, particularly the frame assembly 220, is coupled to the cooling system 210. In some embodiments, the coupling apparatus 215 may be coupled to the cooling system 210 via an adhesive layer 235. The adhesive layer 235 is not limited by this disclosure, and may generally be made of any material that provides adhesive properties. Illustrative materials that may be used in the adhesive layer 235 include, but are not limited to, epoxies, acrylates, siloxane, urethane, poly(arylene ether) based solutions, solder, sintered metal, and/or the like.

The frame assembly 220, which retains the semiconductor device 205 therein, may generally include a first frame member 222 (e.g., a bottom frame member), a second frame member 224 (e.g., a top frame member), and one or more fasteners 226. In some embodiments, the frame assembly 220 may also include a spring assembly 228. However, it should be understood that the spring assembly 228 may also be a component that is separate from the frame assembly 220 (i.e., a part of the coupling apparatus 215).

Figure 3A:
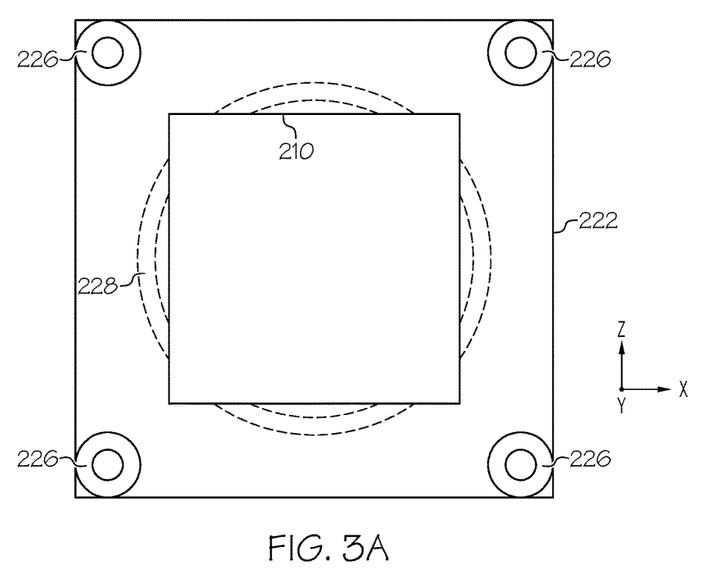
FIG. 3A schematically depicts a top view of the system of FIG. 2.
Figure 3B:
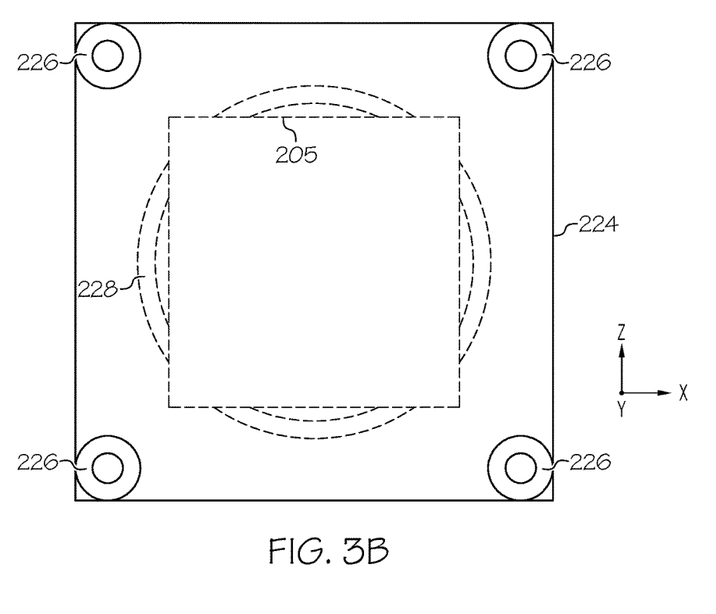
FIG. 3B schematically depicts a bottom view of the system of FIG. 2.

The frame assembly 220 may be arranged such that the first frame member 222 is coupled to the second frame member 224 via the one or more fasteners 226. As described in greater detail herein, the first frame member 222 and the second frame member 224 retain various components therebetween, and thus may not necessarily physically contact each other. As such, the one or more fasteners 226 may extend at least a distance D between the first frame member 222 and the second frame member 224 to couple the first frame member 222 and the second frame member 224 together. The one or more fasteners 226 may generally be positioned at any location with respect to the first frame member 222, the second frame member 224, and/or the various components positioned between the first frame member 222 and the second frame member 224 (e.g., the spring assembly 228 or the semiconductor device 205). However, it should be understood that the one or more fasteners 226 may be positioned so as to not hinder the functioning of the various components located between the first frame member 222 and the second frame member 224. In a nonlimiting example, as shown in FIGS. 3A and 3B, each of the one or more fasteners 226 may be placed radially outwards from a central area of the frame assembly 220, including the first frame member 222 and the second frame member 224. Such a placement of the one or more fasteners 226 may allow the first frame member 222 and the second frame member 224 to be coupled to each other, while avoiding contact, interference, or the like with various components therebetween, such as the spring assembly 228 and/or the semiconductor device 205. In addition, such a placement of the one or more fasteners 226 may allow the first frame member 222 to be coupled to the second frame member 224 while avoiding contact with various components coupled thereto, such as, for example, the cooling system 210.

Referring again to FIG. 2, in some embodiments, the first frame member 222 and/or the second frame member 224 may each contain one or more recesses, passages, openings, and/or the like for connecting the one or more fasteners 226 thereto. For example, as shown in FIG. 2, the first frame member 222 and the second frame member 224 may each have one or more bores 221 therethrough such that a portion of each of the one or more fasteners 226 can be passed through the first frame member 222 and/or the second frame member 224 and secured in place, as described in greater detail herein. However, it should be understood that such an embodiment is merely illustrative, and the frame members 222, 224 may be configured in other manners for receiving the one or more fasteners 226 without departing from the scope of the present disclosure.

The first frame member 222 and the second frame member 224 may be sized and shaped such that they effectively retain and/or compress the various components located therebetween when assembled and coupled together by the one or more fasteners 226. For example, as shown in FIGS. 2 and 3A, the first frame member 222 may be generally larger in particular dimensions than the cooling system 210 and/or the various components between the first frame member 222 and the second frame member 224, such as, for example, the spring assembly 228. Thus, the first frame member 222 may extend a distance in one or more directions along the Z-axis and/or the X-axis beyond the cooling system 210 and/or the spring assembly 228. Similarly, as shown in FIGS. 2 and 3B, the second frame member 224 may be generally larger in particular dimensions than the various components between the first frame member 222 and the second frame member 224, such as, for example, the spring assembly 228 and/or the semiconductor device 205. Thus, the second frame member 224 may extend a distance in one or more directions along the Z-axis and/or the X-axis beyond the spring assembly 228 and/or the semiconductor device 205. It should be understood that such dimensions are merely illustrative and other dimensions are contemplated and possible. For example, in some embodiments, the first frame member 222 and/or the second frame member 224 may be smaller than the cooling system 210 in dimensions that extend along the Z-axis and/or the X-axis. In some embodiments, the first frame member 222 may be about the same dimensions as the second frame member 224. In other embodiments, the first frame member 222 may dimensionally different from the second frame member 224.

The first frame member 222 and the second frame member 224 may each be constructed of materials that are suitable for withstanding high temperatures, can undergo high stress, can withstand clamping forces caused by the coupling via the one or more fasteners 226, are thermoconductors, and/or are electrical conductors. High temperatures and high stress, as used herein, may generally include temperatures and stresses that are typically exhibited in operating power electronics assemblies. Thus, when a power electronics assembly is operating under normal conditions, the increased temperatures and increased stresses exhibited by the power electronics assembly may be considered to be high temperature and/or high stress. Illustrative materials may include, but are not limited to, ceramic materials such as silicon carbide, zinc oxide, alumina, or titanium dioxide, various polymeric materials such as thermally cured high temperature resins, Bakelite, high temperature polyimides, or highly crosslinked polyurethanes, and/or the like.

Figure 4A:
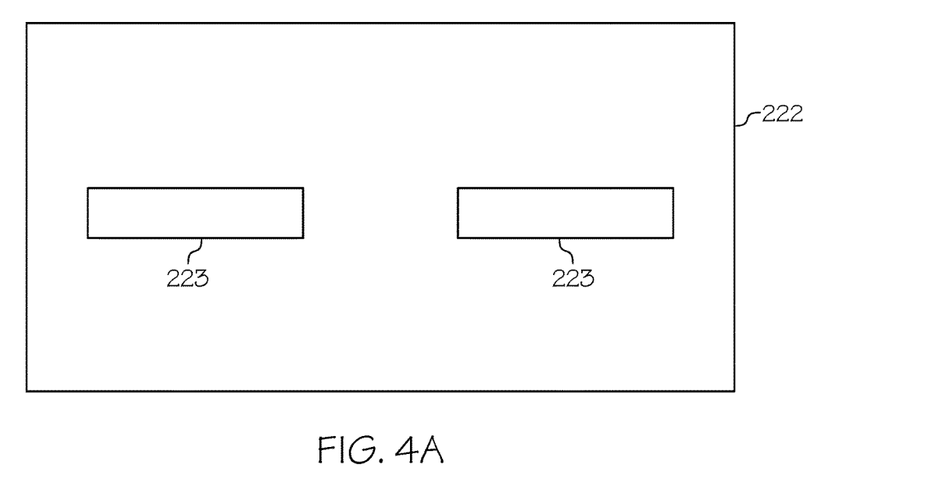
FIG. 4A schematically depicts a top view of a first frame member having contacts embedded therein according to one or more embodiments shown and described herein.
Figure 4B:
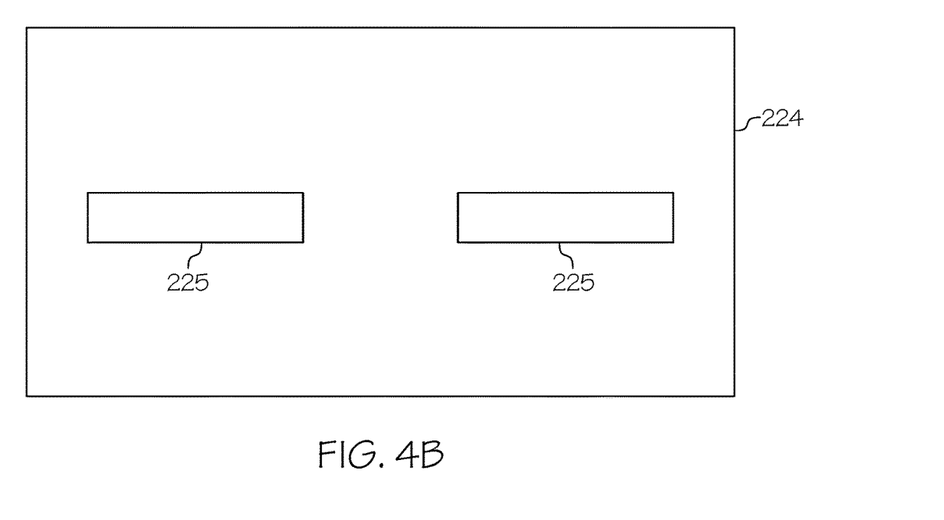
FIG. 4B schematically depicts a bottom view of a second frame member having contacts embedded therein according to one or more embodiments shown and described herein.

In various embodiments, the first frame member 222 and/or the second frame member 224 may be constructed of a particular material and/or particularly configured to act as bus bars, electrical terminals and/or the like. For example, as shown in FIG. 4A, the first frame member 222 may have one or more contacts 223 embedded in or otherwise disposed on a surface thereof, such as the top surface. Similarly, as shown in FIG. 4B, the second frame member 222 may have one or more contacts 225 embedded in or otherwise disposed on a surface thereof, such as the bottom surface. Referring to FIGS. 4A and 4B, the contacts 223, 225 are not limited by this disclosure, and may generally be any electrical conducting component, including metals and/or the like. In some embodiments, the contacts 223, 225 may be connected to various other components through the first frame member 222 and/or the second frame member 224 such that external components can be electrically coupled to the semiconductor device 205 (FIG. 2) via various other components of the system 200, including, but not limited to, the first and second frame members 222, 224, the spring assembly 228, and/or the like.

Referring again to FIG. 2, each of the one or more fasteners 226 may extend between the first frame member 222 and the second frame member 224 to couple the frame members 222, 224 together as described hereinabove. In addition, the one or more fasteners 226 may provide a clamping force $F_C$ upon the semiconductor device 205 by pressing the first frame member 222 and the second frame member 224 towards each other. Such a clamping force $F_C$ may function to retain the semiconductor device 205 in a fixed position between the first frame member 222 and the second frame member 224. In some embodiments, the clamping force $F_C$ may further maintain a positioning of the semiconductor device 205 with respect to one or more other components of the system 200. For example, the clamping force $F_C$ may maintain the position of the semiconductor device 205 with respect to the spring assembly 228 and/or the one or more contacts 223 (FIG. 4A) embedded in the first frame member 222.

It should generally be understood that the one or more fasteners 226 are not limited by this disclosure, and any mechanical fastening device(s) that couple the first frame member 222 to the second frame member 224 and/or provide the clamping force $F_C$ may be used without departing from the scope of the present disclosure. Illustrative examples of the one or more fasteners 226 include, but are not limited to, screws, bolts and nuts, clips, clamps, and/or the like. In addition, in some embodiments, the one or more fasteners 226 may be components that are separate and removable from the first frame member 222 and/or the second frame member 224. In other embodiments, the one or more fasteners 226 may be integrated with the first frame member 222 and/or the second frame member 224. For example, the first frame member 222 may incorporate the one or more fasteners 226 (e.g., one or more clips integrated with the first frame member 222), which may engage with the second frame member 224 to couple the first frame member 222 to the second frame member 224.

In various embodiments, the spring assembly 228 is positioned such that it is located between the first frame member 222 and the semiconductor device 205. In some embodiments, the spring assembly 228 may be configured such that it biases the semiconductor device 205 in a direction along the Y-axis towards the second frame member 222. Thus, in some embodiments, the spring assembly 228 may contribute to the clamping force $F_C$ provided by the first frame member 222 and the second frame member 224.

The spring assembly 228 may generally be constructed of any materials that are suitable for providing a biasing force on the semiconductor device 205. In some embodiments, the spring assembly 228 may be constructed of one or more materials that are thermoconductive and/or act as electrical conductors. In a nonlimiting example, the spring assembly 228 may be constructed of a material that allows for heat flux to pass therethrough, such as heat generated by the semiconductor device 205 and passed to the cooling system 210. In another nonlimiting example, the spring assembly 228 may be constructed of a material that allows for electrical signals to transmit therethrough between the semiconductor device 205 and one or more other components, such as external components, the one or more contacts 223, 225 (FIGS. 4A-4B) embedded in the first and second frame members 222, 224, and/or the like. Illustrative thermoconductive materials used to form the spring assembly 228 may include, but are not limited to, rubber, silicone, polyvinyl chloride (PVC), thermoplastic materials, and materials containing carbon and/or metal fillings. Illustrative materials that act as electrical conductors that may be used to form the spring assembly 228 include, but are not limited to, conductive metals such as silver, platinum, gold, aluminum, copper, and/or the like, various carbon-based materials, tungsten, palladium, and titanium.

The spring assembly 228 is not limited to any particular design and configuration. Thus, the spring assembly 228 may be any type of compliant member, such as a single spring or a plurality of springs. Thus, the terms "compliant member" and "spring assembly" may be used herein interchangeably. In addition, the spring assembly 228 may exhibit a particular stiffness to ensure a consistent compliance. A suitable particular stiffness to ensure a particular compliance should be recognized and understood.

The size of the spring assembly 228 is not limited by this disclosure, and may generally include any size components. In some embodiments, the spring assembly 228 may be nanoscale sized (e.g., having one or more dimensions that are 0-1000 nanometers). In some embodiments, the spring assembly 228 may be microscale sized (e.g., having one or more dimensions that are 0-1000 micrometers). In some embodiments, the spring assembly 228 may be macroscale sized (e.g., having various dimensional aspects such that the spring assembly 228 is visible to the naked eye).

Illustrative examples of spring types include, but are not limited to, a flat spring, a coil spring, and a V-spring. An illustrative flat spring is depicted in FIG. 2. As used herein, a "flat spring" refers to a spring that has at least one flat surface that coplanar with the first frame member 222 and/or the semiconductor device 205 and has a center portion that can move in any direction (particularly the +Z/−Z and +X/−X directions) while maintaining the coplanar positioning of the at least one surface. For example, as shown in FIG. 2, the spring assembly 228 may have a first surface 227 that is coplanar with the semiconductor device 205 and a second surface 229 that is coplanar with the first frame member 222.

Figure 5:
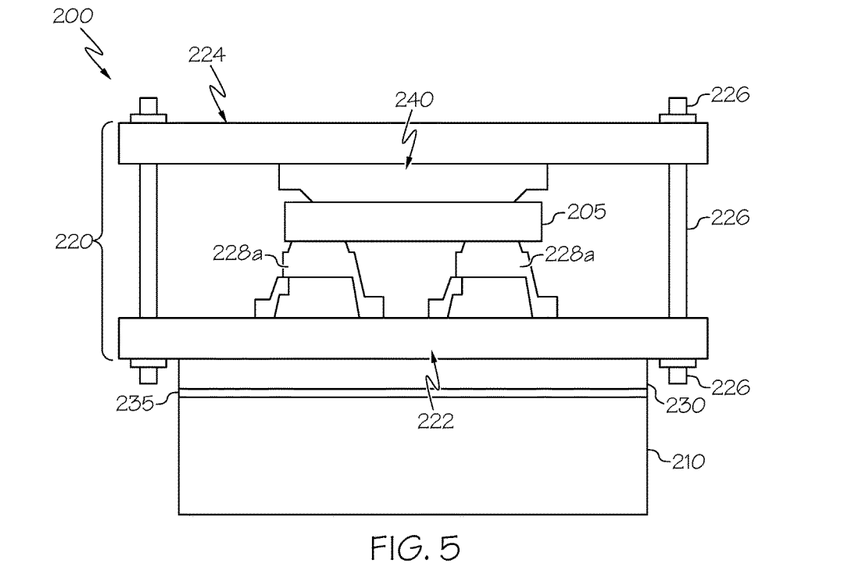
FIG. 5 schematically depicts a side view of another system including a coupling apparatus according to one or more embodiments shown and described herein.
Figure 6:
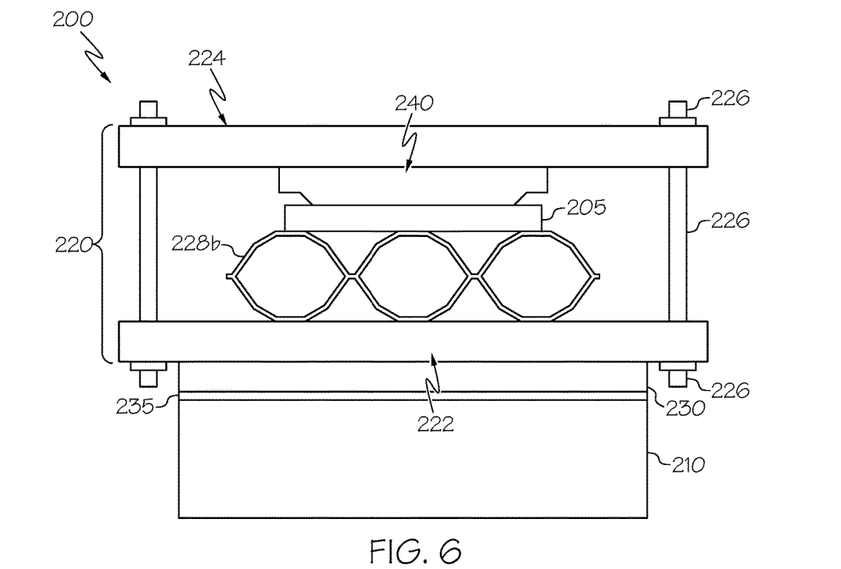
FIG. 6 schematically depicts a side view of yet another system including a coupling apparatus according to one or more embodiments shown and described herein.
Figure 7A:
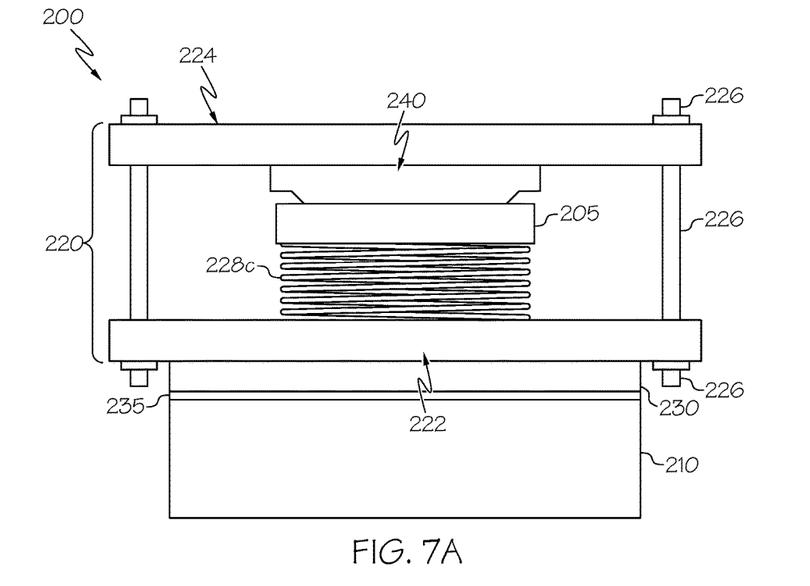
FIG. 7A schematically depicts a side view of yet another system including a coupling apparatus according to one or more embodiments shown and described herein.
Figure 7B:
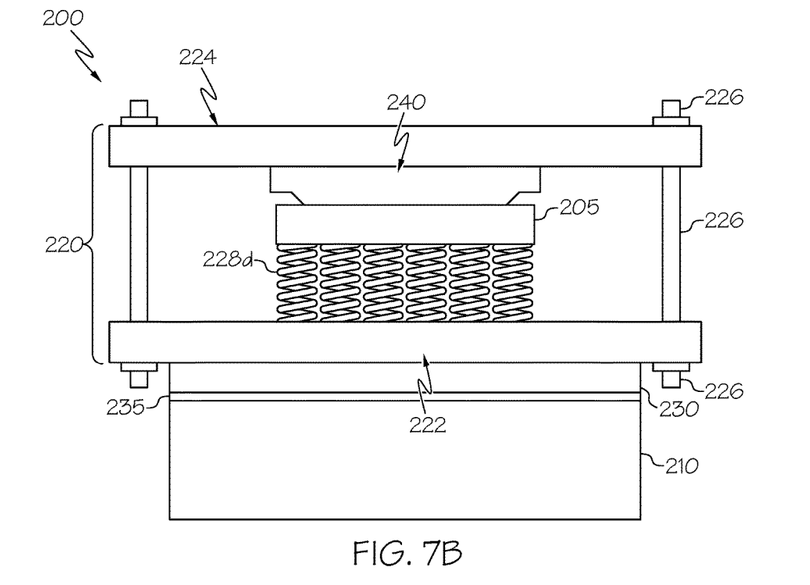
FIG. 7B schematically depicts a side view of yet another system including a coupling apparatus according to one or more embodiments shown and described herein.
Figure 8:
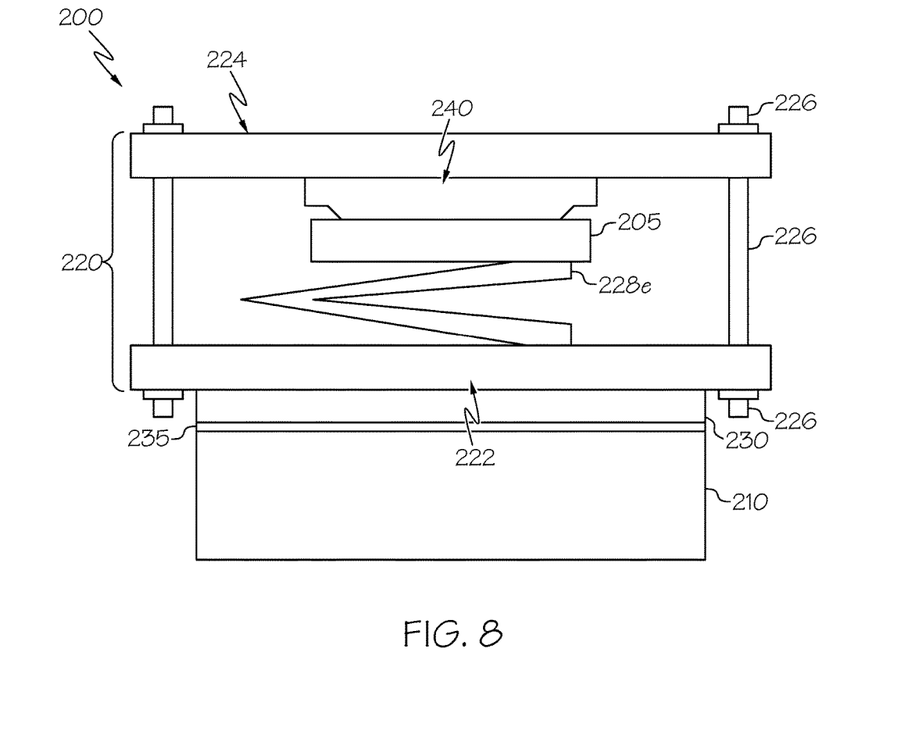
FIG. 8 schematically depicts a side view of yet another system including a coupling apparatus according to one or more embodiments shown and described herein.

Other illustrative examples of the spring assembly 228 are depicted in FIGS. 5-8. For example, FIG. 5 depicts a plurality of flat springs 228*a* disposed between the first frame member 222 and the semiconductor device 205. FIG. 6 shows an alternative spring assembly that includes a plurality of elliptic leaf springs 228*b*. FIG. 7A depicts a single helical or coil type spring 228*c*, and FIG. 7B depicts a plurality of helical or coil type springs 228*c*. In some embodiments, as shown in FIG. 8, the spring assembly may be a V-spring 228*d*. The V-spring 228*d* generally contains a V shape, with a pair of angularly spaced wing sections joined together to form a vertex. The first wing section may contact the first frame member 222 and the second wing section may contact the semiconductor device 205. It should be understood that the various spring assemblies described herein are merely illustrative, and any other spring assembly now known or later developed may be used for the spring assembly without departing from the scope of the present disclosure.

By providing both a first frame member 222 and a second frame member 224 as described herein, as well as clamping the first and second frame members 222, 224 together, the coupling apparatus 215 described herein avoids problems that may exist in systems or apparatuses that do not include both the first frame member 222 and/or the second frame member 224. Particularly, in such systems or apparatuses, a frame member may be directly coupled to a substrate/ cooling system, which, under typical operating circumstances, could potentially cause damage to the substrate/cooling system. For example, if a frame member is clamped to the substrate/cooling system too tightly, it could potentially damage the substrate/cooling system. In addition, providing the first frame member 222 between the semiconductor device 205 and the cooling system 210 may provide an advantage over other systems and apparatuses in which a cooling system is directly coupled to the semiconductor device because the first frame member 222 isolates the semiconductor device 205 from the cooling system 210, and in the event of malfunction of one of the components (i.e., the semiconductor device 205 or the cooling system 210), the particular arrangement can help to avoid damage to the other, non-malfunctioning device. As such, the malfunctioning device can be replaced without having to replace all of the other non-malfunctioning components.

Referring again to FIG. 2, in some embodiments, the coupling apparatus 215 may further include a top layer 240 disposed between the semiconductor device 205 and the second frame member 224. The top layer 240 may generally be a layer of material that is disposed on the semiconductor device 205. The top layer 240 may act as a lid and/or an electrical contact. In embodiments, the top layer 240 may be an electrically conductive material and/or a thermally conductive material. Illustrative electrically conductive materials include, but are not limited to, conductive metals such as silver, platinum, gold, aluminum, copper, and/or the like, various carbon-based materials, tungsten, palladium, and titanium. Illustrative thermally conductive materials include, but are not limited to, rubber, silicone, polyvinyl chloride (PVC), thermoplastic materials, and materials containing carbon and/or metal fillings. In some embodiments, the top layer 240 may be constructed of such electrically conductive and/or thermally conductive materials to allow for heat flux and/or electrical transmissions therethrough from the semiconductor device 205 to external objects and/or devices.

In various embodiments, the coupling apparatus 215 may further include an optional bottom layer 230 disposed between the first frame member 222 and the cooling system 210. The bottom layer 230 may generally be a layer of material that is disposed on the cooling system 210. In embodiments, the bottom layer 230 may be an electrically conductive material and/or a thermally conductive material. Illustrative electrically conductive materials include, but are not limited to, conductive metals such as silver, platinum, gold, aluminum, copper, and/or the like, various carbon-based materials, tungsten, palladium, and titanium. Illustrative thermally conductive materials include, but are not limited to, rubber, silicone, polyvinyl chloride (PVC), thermoplastic materials, and materials containing carbon and/or metal fillings. In some embodiments, the bottom layer 230 may be constructed of such electrically conductive and/or thermally conductive materials to allow for heat flux and/or electrical transmissions therethrough from various other components of the system 200 to external objects and/or devices. In some embodiments, the bottom layer 230 may be constructed of such thermally conductive materials to allow for heat flux between the frame assembly 220 (as well as the components between the first frame member 222 and the second frame member 224) and the cooling system 210. In some embodiments, the bottom layer 230 may be bonded to the frame assembly 220 (or component thereof, such as the first frame member 222) via a bonding material, such as, but not limited to, direct bonded copper (DBC), and/or the like. As the bottom layer 230 is optional, in some embodiments, the coupling apparatus 215 may be directly coupled to the cooling system 210 via the adhesive layer 235.

FIGS. 9-13 depict flow diagrams of various methods for coupling the semiconductor device 205 to the cooling system 210 according to various embodiments. It should be understood that any of the methods described with respect to FIGS. 9-13 may be combined together without departing from the scope of the present disclosure.

Figure 9:
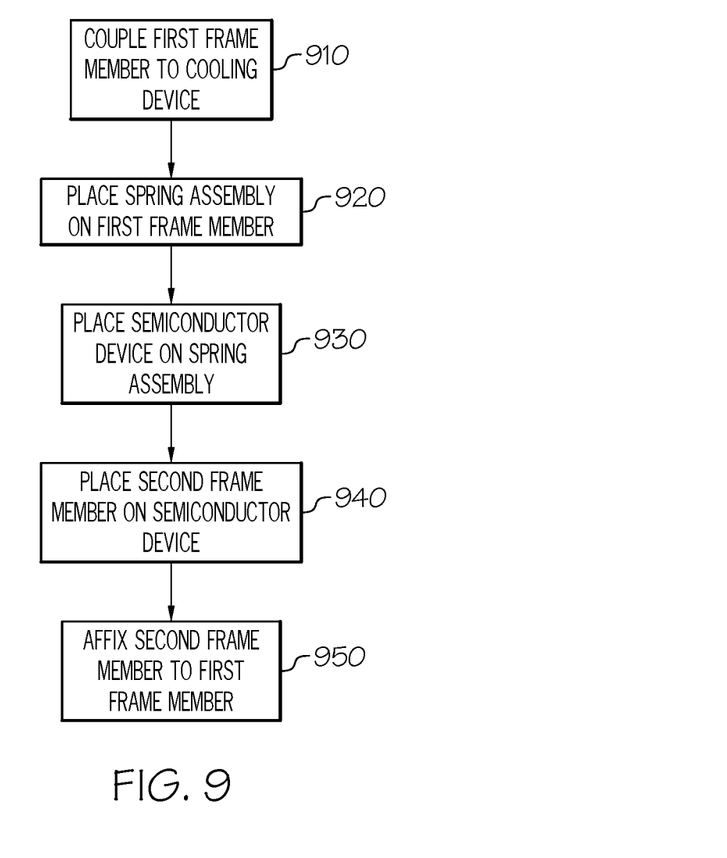
FIG. 9 depicts a flow diagram of an illustrative method of coupling a semiconductor device to a cooling system according to one or more embodiments shown and described herein.

Referring now to FIGS. 2 and 9, an illustrative method of coupling the semiconductor device 205 to the cooling system 210 may include coupling the first frame member 222 to the cooling system 210, as shown in step 910. The first frame member 222 may be coupled to the cooling system 210 via an adhesive, a bonding material, and/or the like, particularly adhesives and bonding materials described herein.

In step 920, the spring assembly 228 may be placed on the first frame member 222, and in step 930, the semiconductor device 205 may be placed on the spring assembly 228. Placing the spring assembly 228 on the first frame member 222 may include placing a single spring or a plurality of springs, including the various springs described herein. Thereafter, as shown in steps 940 and 950 respectively, the second frame member 224 may be placed on the semiconductor device 205 and may further be affixed to the first frame member 222. For example, the second frame member 222 may be affixed to the first frame member 222 via the one or more fasteners 226, as described in greater detail herein.

Figure 10:
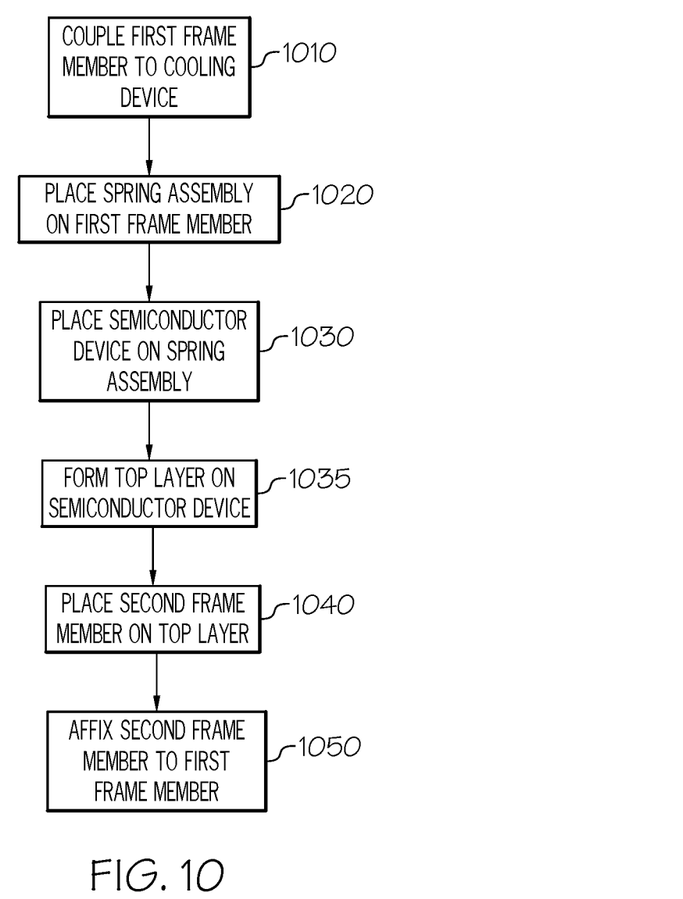
FIG. 10 depicts a flow diagram of another illustrative method of coupling a semiconductor device to a cooling system according to one or more embodiments shown and described herein.

Referring now to FIGS. 2 and 10, in some embodiments, an illustrative method may include coupling the first frame member 222 to the cooling system 210 in step 1010, placing the spring assembly 228 on the first frame member 222 in step 1020, placing the semiconductor device 205 on the spring assembly 228 in step 1030, forming the top layer 240 on the semiconductor device 205 in step 1035, placing the second frame member 224 on the top layer 240 in step 1040, and affixing the second frame member 224 to the first frame member 222 in step 1050. The top layer 240 may be formed on the semiconductor device 205 using any method, such as, for example, depositing a molten material on the semiconductor device 205 and allowing it to form the top layer 240. In another example, a previously-formed top layer 240 may be placed on the semiconductor device 205. In yet another example, the top layer 240 may be formed between the semiconductor device 205 and the second frame member 224 by injecting the top layer material between the semiconductor device 205 and the second frame member 224.

Figure 11:
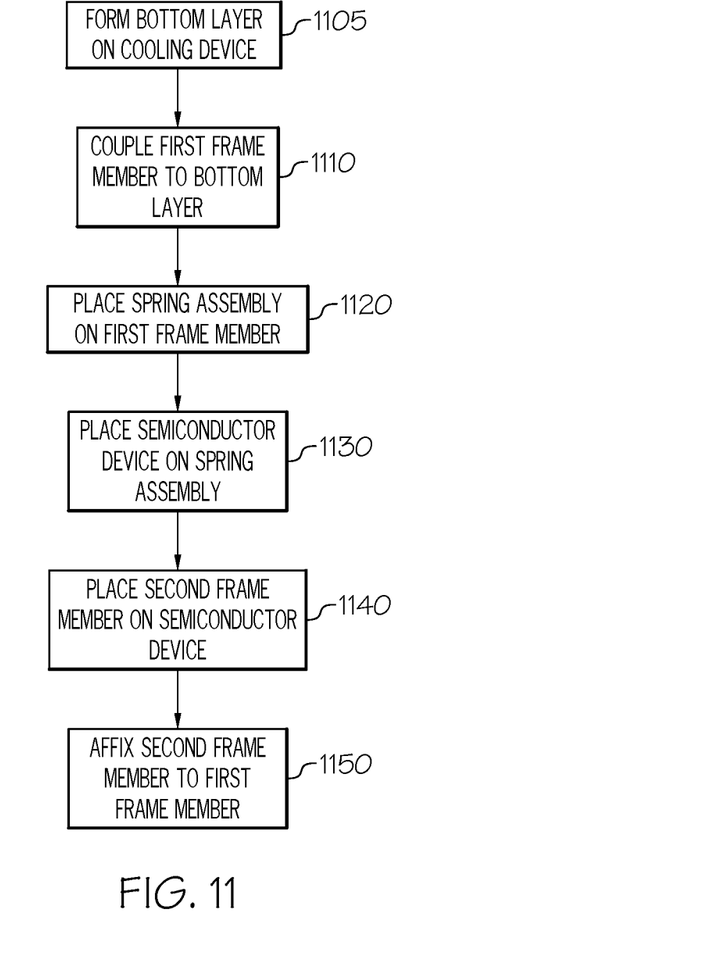
FIG. 11 depicts a flow diagram of yet another illustrative method of coupling a semiconductor device to a cooling system according to one or more embodiments shown and described herein.

Referring now to FIGS. 2 and 11, in some embodiments, an illustrative method may include forming the bottom layer 230 on the cooling system 210 in step 1105, coupling the first frame member 222 to the bottom layer 230 in step 1110, placing the spring assembly 228 on the first frame member 222 in step 1120, placing the semiconductor device 205 on the spring assembly 228 in step 1130, placing the second frame member 224 on the semiconductor device 205 in step 1140, and affixing the second frame member 224 to the first frame member 222 in step 1150. The bottom layer 230 may be formed on the cooling system 210 using any method, such as, for example, depositing a molten material on the cooling system 210 and allowing it to form the bottom layer 230. In another example, a previously-formed bottom layer 230 may be placed on the cooling system 210. In yet another example, the bottom layer 230 may be formed between the cooling system 210 and the first frame member 222 by injecting the bottom layer material between the cooling system 210 and the first frame member 222.

Figure 12:
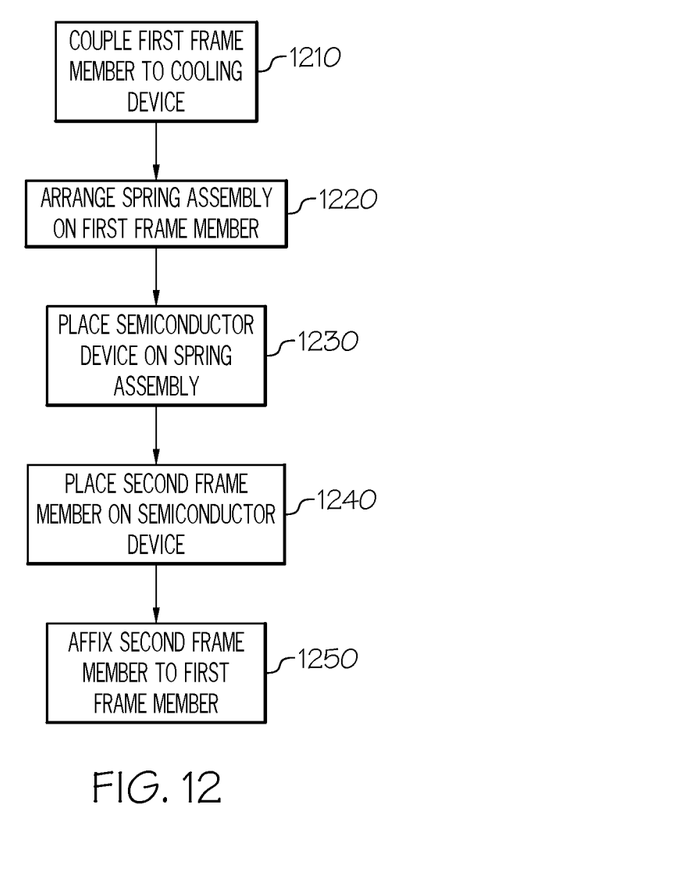
FIG. 12 depicts a flow diagram of yet another illustrative method of coupling a semiconductor device to a cooling system according to one or more embodiments shown and described herein.

Referring now to FIGS. 2 and 12, in some embodiments, an illustrative method may include coupling the first frame member 222 to the cooling system 210 in step 1210, arranging the spring assembly 228 on the first frame member 222 in step 1220, placing the semiconductor device 205 on the spring assembly 228 in step 1230, placing the second frame member 224 on the semiconductor device 205 in step 1240, and affixing the second frame member 224 to the first frame member 222 in step 1250. Arranging the spring assembly 228 may generally include positioning the spring assembly 228 such that it functions as described herein. That is, the spring assembly 228 may be arranged such that it biases the semiconductor device 205 towards the second frame member 224, is coplanar with various components of the system 200, and/or is contacting one or more contacts located in the semiconductor device 205 and/or the contacts 223 (FIG. 4A) embedded in the first frame member 222. In some embodiments, such arranging of the spring assembly 228 may ensure electrical communication between the semiconductor device 205 and one or more other components, including external components, the first frame member 222, and/or the like.

Figure 13:
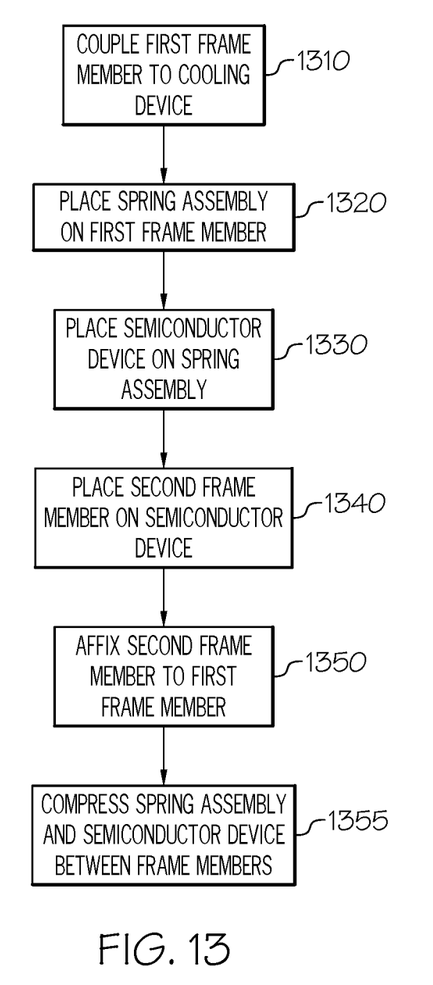
FIG. 13 depicts a flow diagram of yet another illustrative method of coupling a semiconductor device to a cooling system according to one or more embodiments shown and described herein.

Referring now to FIGS. 2 and 13, in some embodiments, an illustrative method may include coupling the first frame member 222 to the cooling system 210 in step 1310, placing the spring assembly 228 on the first frame member 222 in step 1320, placing the semiconductor device 205 on the spring assembly 228 in step 1330, placing the second frame member 224 on the semiconductor device 205 in step 1340, affixing the second frame member 224 to the first frame member 222 in step 1350, and compressing the spring assembly 228 and the semiconductor device 205 between the frame members 222, 224. In some embodiments, compressing the spring assembly 228 and the semiconductor device 205 may be completed as a part of step 1350. That is, affixing the second frame member 224 to the first frame member 222 may automatically include compressing the spring assembly 228 and the semiconductor device 205 between the frame members 222, 224. In other embodiments, compressing the spring assembly 228 and the semiconductor device 205 may be completed, for example, by tightening the one or more fasteners 226 to cause a compressive force, by placing an external compressive force on the frame assembly 220, and/or the like. Such compression of the spring assembly 228 and the semiconductor device 205 may ensure that the semiconductor device 205 is appropriately retained within the frame assembly 220, appropriately contacts the various other components of the system 200, as described herein, and/or the like. In addition, such compression may ensure that the system 200 functions as described herein.

It should be understood that the steps described herein with respect to FIGS. 9-13 may be combined together in any manner without departing from the scope of the present application. For example, in some embodiments, the steps described herein with respect to FIG. 9 may optionally be combined with step 1035, as described with respect to FIG. 10, as well as with step 1105, as described with respect to FIG. 11 to obtain a system 200 that includes the bottom layer 230 and the top layer 240.

Accordingly, it should now be understood that the apparatuses, systems, and methods described herein provide for a frame assembly that retains a semiconductor device therein, where the frame assembly is attached to a cooling system. In addition, a spring assembly located within the frame assembly maintains the positioning of the semiconductor device. Use of such a frame assembly eliminates the need for a bond layer to hold the semiconductor device to the cooling system. As such, issues relating to remelting, cracking, reusability of parts, and/or the like are avoided, as the spring assembly is more compliant than a bond layer and is not susceptible to the various issues that result from using a bond layer.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An apparatus for coupling a semiconductor device to a cooling system, the apparatus comprising:
    a first frame member coupled to the cooling system;
    a second frame member coupled to the first frame member by one or more fasteners; and
    a spring assembly disposed between the first frame member and the second frame member, the spring assembly formed of a thermally conductive material,
    wherein:
        the semiconductor device is disposed between the spring assembly and the second frame member, and
        the spring assembly directly contacts the semiconductor device and the first frame member such that heat flux passes from the semiconductor device to the cooling system via the spring assembly and the first frame member.

2. The apparatus of claim 1, further comprising a top layer disposed between the semiconductor device and the second frame member, wherein the top layer is a lid or electrical contact and comprises a material that is one or more of an electrically conductive material and a thermally conductive material.

3. The apparatus of claim 1, wherein the first frame member is coupled to the cooling system by a bottom layer disposed between the first frame member and the cooling system.

4. The apparatus of claim 1, wherein the spring assembly is further formed of an electrically conductive material.

5. The apparatus of claim 1, wherein the spring assembly comprises a single spring.

6. The apparatus of claim 1, wherein the spring assembly comprises a plurality of springs.

7. The apparatus of claim 1, wherein the spring assembly comprises one or more of a flat spring, a coil spring, and a V-spring.

8. The apparatus of claim 1, wherein the second frame member and the first frame member provide a compressive force on the spring assembly and the semiconductor device to retain the spring assembly and the semiconductor device in a held configuration.

9. The apparatus of claim 1, wherein the first frame member and the second frame member are each formed of at least one of an electrically conductive material and a thermally conductive material.

10. The apparatus of claim 1, wherein at least one of the second frame member and the first frame member comprises one or more contacts embedded therein.

* * * * *